US00RE40995E

(19) United States
(12) Reissued Patent
Ghodsi

(10) Patent Number: US RE40,995 E
(45) Date of Reissued Patent: Nov. 24, 2009

(54) MULTI-ELEMENT RESISTIVE MEMORY

(75) Inventor: Ramin Ghodsi, Cupertino, CA (US)

(73) Assignee: Micron Technology, Inc., Boise, ID (US)

(21) Appl. No.: 11/905,752

(22) Filed: Oct. 3, 2007

Related U.S. Patent Documents

Reissue of:
(64) Patent No.: 7,145,795
Issued: Dec. 5, 2006
Appl. No.: 10/822,785
Filed: Apr. 13, 2004

(51) Int. Cl.
*G11C 11/00* (2006.01)

(52) U.S. Cl. ..... 365/158; 365/148; 365/171; 365/173; 365/97; 365/100; 257/295; 338/32

(58) Field of Classification Search ..... 365/158, 365/148, 171, 173, 97, 100; 257/295; 338/32
See application file for complete search history.

(56) References Cited

U.S. PATENT DOCUMENTS 6,791,859 B2 9/2004 Hush et al.
6,850,433 B2 2/2005 Sharma et al.
6,903,396 B2 6/2005 Tuttle
6,924,520 B2 * 8/2005 Park et al. ..... 257/295
6,940,748 B2 9/2005 Nejad et al.
7,149,100 B2 * 12/2006 Nazarian ..... 365/46
7,264,985 B2 * 9/2007 Chung et al. ..... 438/48
2002/0036918 A1 * 3/2002 Hidaka ..... 365/171
2002/0123170 A1 9/2002 Moore et al.
2002/0123248 A1 9/2002 Moore et al.
2003/0001229 A1 1/2003 Moore et al.
2003/0032254 A1 2/2003 Gilton
2003/0045049 A1 3/2003 Campbell et al.
2004/0037152 A1 * 2/2004 Ooishi ..... 365/230.03
2004/0108561 A1 * 6/2004 Jeong ..... 257/422
2005/0216244 A1 9/2005 Nahas
2006/0002186 A1 * 1/2006 Frey ..... 365/173
2007/0041242 A1 * 2/2007 Okazaki et al. ..... 365/154

* cited by examiner

*Primary Examiner*—Van Thu Nguyen
*Assistant Examiner*—Eric Wendler
(74) *Attorney, Agent, or Firm*—Dickstein Shapiro LLP

(57) ABSTRACT

A memory device, *and methods relating thereto,* having memory cells in which [a single] *an* access transistor controls the grounding of at least two [storage] *resistive memory* elements[, such as resistive storage elements,] for purposes of reading the respective logical states of the storage elements. The logical states of the storage elements are decoupled from one another and are read independently. The storage elements are disposed in respective layers. Each storage element is coupled to first and second conductors [having] *for reading the memory that have* respective, *parallel,* longitudinal axes. [The longitudinal axes are oriented substantially parallel to one another, at least in proximity to a particular storage element.]

41 Claims, 13 Drawing Sheets

MULTI-ELEMENT RESISTIVE MEMORY

Matter enclosed in heavy brackets [ ] appears in the original patent but forms no part of this reissue specification; matter printed in italics indicates the additions made by reissue.

FIELD OF INVENTION

The present invention relates to the field of resistive memory, two examples of which are a Magnetic Random Access Memory (MRAM) and a Programmable Conductive Random Access Memory (PCRAM). More particularly, it relates to a transistor-switched resistive memory architecture.

BACKGROUND OF THE INVENTION

Resistive memory integrated circuits represent data using an electrical resistance of a resistive memory element. One group of resistive memory technologies is Magnetic Random Access Memory (MRAM) technology. Another is Programmable Conductive Random Access Memory (PCRAM). These resistance memory technologies have the ability to provide non-volatile or semi-volatile random access memory devices which require no, or infrequent, refreshing.

MRAM technology operates by sensing the electrical resistance of a magneto-resistive memory element, where the resistance depends on a magnetization state of the memory element. When the resistive memory element is magnetized with a field oriented in a first direction, it represents a first stored logical state. When the element is magnetized with a field oriented in a second direction, it represents a second, different, logical state. The orientation of the magnetic field of the memory cell is altered by passing electrical currents through one or more conductors disposed in proximity to the magneto-resistive memory element.

It is known, for example, to use Magnetic Tunnel Junction (MTJ) devices as magneto-resistive memory elements. The resistance of an MJT device depends on the level of quantum tunneling that occurs across a thin dielectric film interposed between two magnetic electrical conductors. One of the magnetic electrical conductors is referred to as a "pinned layer" and has a relatively high magnetic coercivity. The pinned layer has a magnetic field direction fixed in a first orientation. The other magnetic electrical conductor is referred to as a "sense layer" (or "programmed layer"). The magnetic coercivity of the sense layer is low, as compared with that of the pinned layer, and the sense layer is subject to magnetization and re-magnetization to change the orientation of its magnetic field direction through during operation of the MRAM device.

When the sense layer is magnetized to have a magnetic field direction parallel to that of the pinned layer (the "easy" direction), the electrical resistance of the device has a first value. When the sense layer is magnetized to have a magnetic field direction anti-parallel to that of the pinned layer (the "hard" direction), the electrical resistance of the device has a second value. The two values of electrical resistance are used to represent two binary values, and thus store a binary digit (bit) of data. Toggling the sense layer magnetization between the easy and hard directions represents toggling between bit states.

A typical MRAM device includes many memory elements along with bit and word lines and addressing and driving circuitry. Some MRAM devices include access transistors adapted to disconnect each memory cell from the word and/or bit lines except when the particular memory cell is being read. This architecture produces reliable and fast data access at the expense of reduced storage density. In an alternative "crosspoint" architecture, MRAM memory elements are directly connected between word and bit lines, without access transistors. This approach increases data density at the expense of relatively more difficult data state sensing operations and consequently slower data access.

It is desirable to have a resistive memory device with both high access speed and high storage density.

SUMMARY OF THE INVENTION

Embodiments of the invention provide a resistive memory device with both high access speed and high storage density. The embodiments include physically layered resistive memory elements and respective controlled access transistors. In one exemplary embodiment, the invention includes access transistors in a NOR-structured architecture, with each transistor coupled to a plurality of layered resistive memory devices. In this embodiment, the inclusion of an access transistor in each memory cell allows fast read operations with relatively simple read circuitry. Because the MRAM storage elements are layered, one upon another, high storage density is achieved.

Embodiments of the invention also include a plurality of multi-bit MRAM cells disposed in an array. Each MRAM cell includes at least one access transistor. The access transistor is a field effect transistor with a source coupled to a device ground and a gate coupled to a word-line. Each access transistor has a drain mutually coupled to respective pinned layers of at least first and second MRAM resistive elements. Each resistive element includes, in addition to a pinned layer, a sense layer and an insulating layer. The sense and pinned layers of the first and second resistive elements of each cell are disposed in substantially parallel spaced relation to one another, and the two resistive elements are stacked such that the two resistive elements are disposed one above another and above the access transistor of the cell. The sense layer of each resistive element is coupled to a read/write conductor of the array. The resulting arrangement includes resistive storage elements disposed in two or more two-dimensional layers to form a three-dimensional array of resistive storage elements.

Embodiments of the invention also include a plurality of switching devices (transistors) disposed in a two-dimensional array of transistors such that the two-dimensional array of transistors is disposed along a face of the three-dimensional array of resistive storage elements. Each transistor is coupled to, and controls, the resistive elements disposed above it in the three-dimensional array. In one aspect of the invention, the transistors, such as wired-NOR transistors, are formed according to conventional FLASH-memory technology. This presents the advantage of employing previously developed equipment and procedures which may consequently be available at reduced cost.

In other embodiments of the invention PCRAM memory elements are employed in place of the MRAM resistance elements described above. In PCRAM, the memory element includes a resistance variable or capacitance variable material, such as a chalcogenic material, disposed between two electrodes. An electrical potential impressed across the two electrodes can cause the resistance variable or capacitance variable material to change state in a detectable fashion. For example, the resistance or capacitance between the electrodes may be varied. Further description of PCRAM memory elements is found in U.S. patent application Publication No. U.S. 2003/0032254-A1 to Gilton (Feb. 13, 2003), U.S. patent application Publication No. U.S. 2003/00405049-A1 to Campbell et al. (Mar. 6, 2003), U.S. patent application Publication No. U.S. 2003/0001229-A1 to Moore et al. (Jan. 2, 2003), U.S. patent application Publication No. U.S. 2003/0123248-A1 to Moore et al. (Sep. 5, 2002), U.S. patent application Publication No. U.S. 2003/0123170-A1 to Moore et al. (Sep. 5, 2002), which publications are herewith incorporated in their entirety.

BRIEF DESCRIPTION OF THE DRAWINGS

The foregoing and other advantages and features of the invention will become more apparent from the detailed description of exemplary embodiments of the invention given below with reference to the accompanying drawings, in which.

DETAILED DESCRIPTION OF THE INVENTION

Figure 1A:
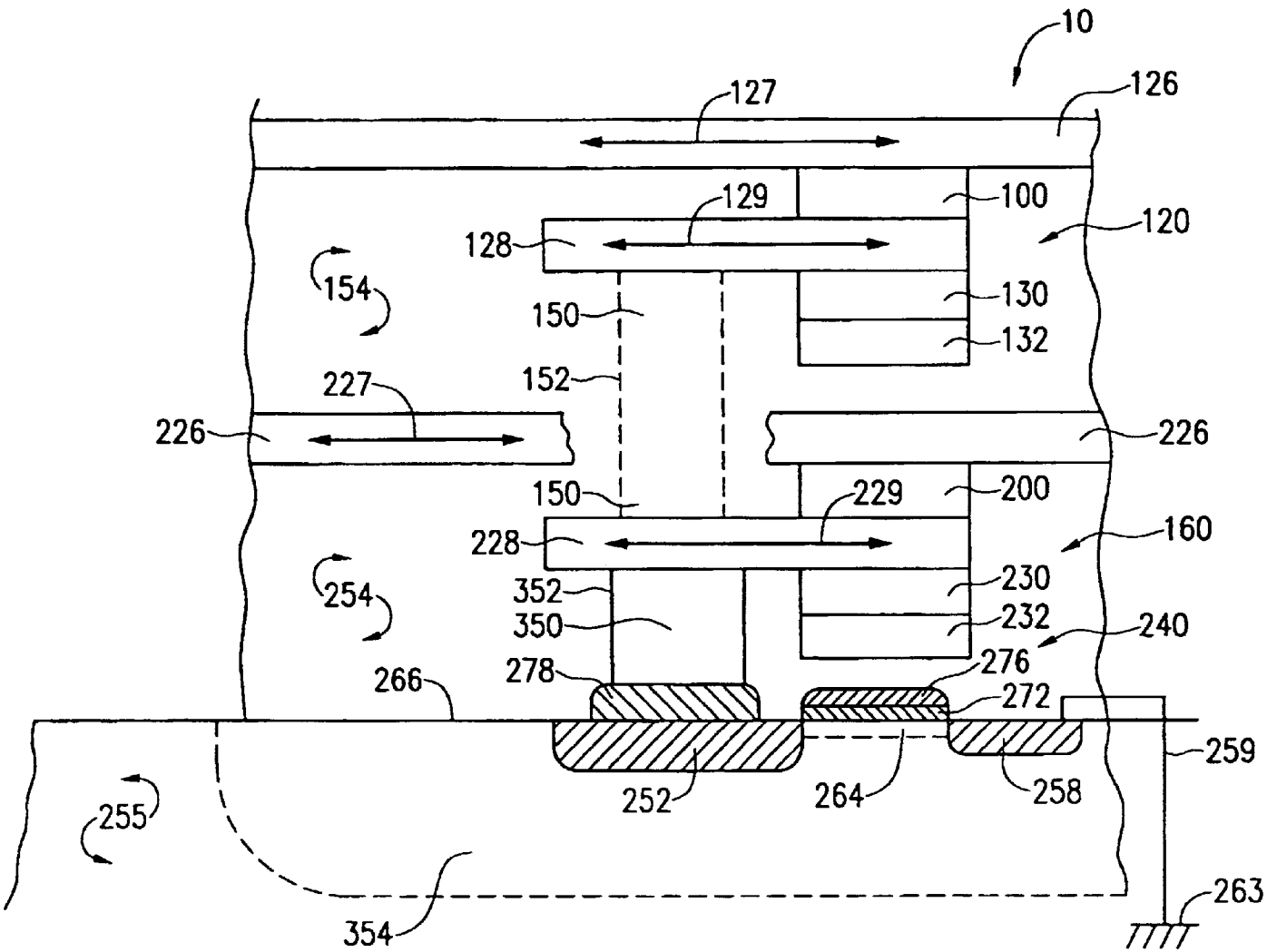
FIG. 1A shows a sectional side view of an MRAM cell according to one embodiment of the invention.
Figure 2:
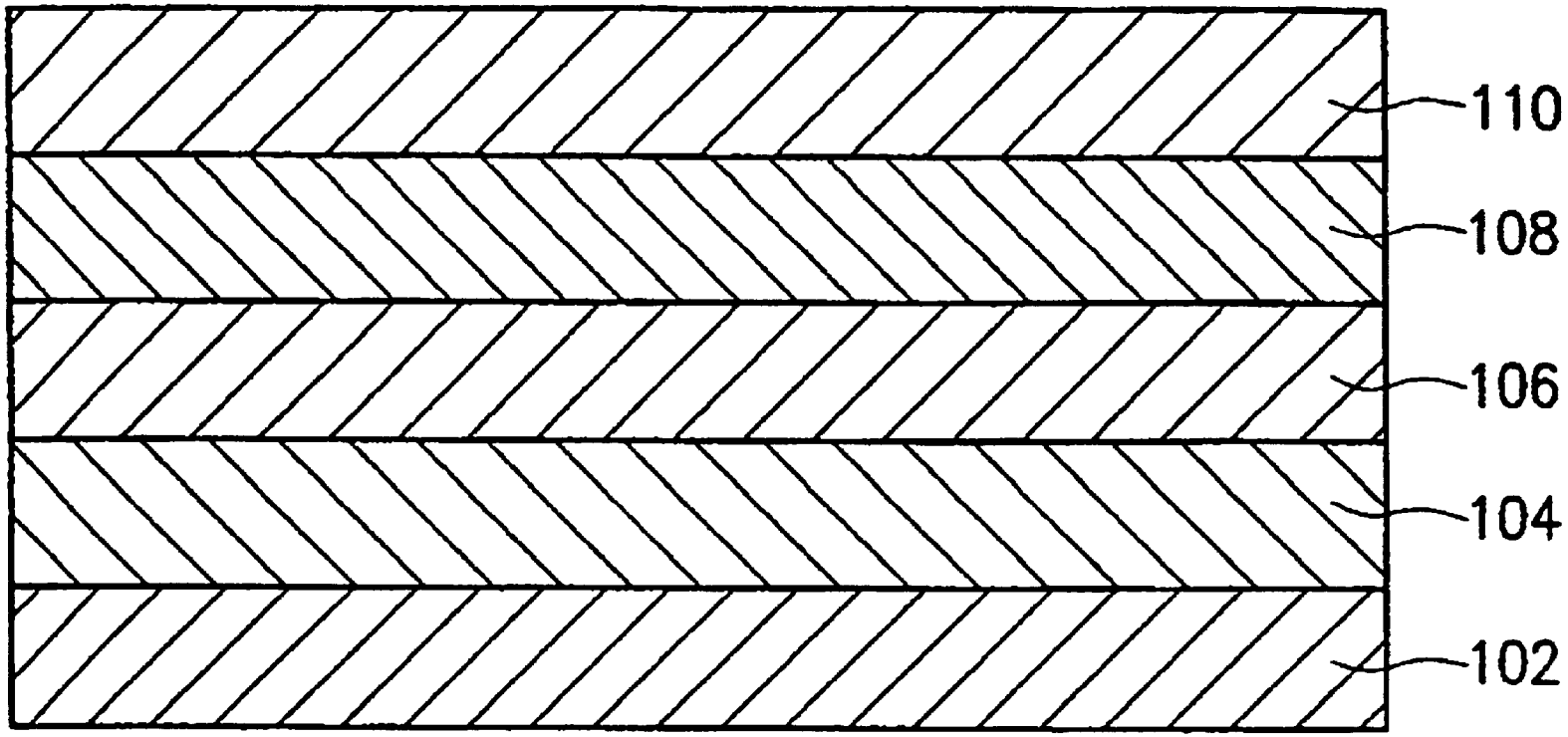
FIG. 2 PRIOR ART
FIG. 2 shows an MRAM memory storage element including five layers of material.

The invention embodiments described herein are described in relation to an MRAM resistive memory cell. However, it should be understood that the invention has more general applicability to any resistive memory cell, such as in, for example, a programmable conductive Random Access Memory (PCRAM). FIG. 1A shows an embodiment of a resistive memory cell 10 e.g., an MRAM cell, according to one embodiment of the invention. The cell 10 includes an upper memory portion 120 and a lower memory portion 160. Each memory portion 120, 160 has a conventional MRAM storage element 100, 200. As shown in FIG. 2, the exemplary MRAM storage elements 100, 200 each include five layers of material in a stacked arrangement. The layers include a seed layer 102, pinning layer 104, pinned layer 106, dielectric layer 108, and a sense layer 110. As discussed above, the pinned layer 106 exhibits a magnetic field in an orientation that is permanently set during manufacturing. Other layers and arrangements may be used for MRAM storage elements 100, 200, or for other types of resistive memory.

Referring again to FIG. 1A, the first MRAM storage element 100 is coupled at an upper surface to a first read/write conductor 126 and at a lower surface to a first read conductor 128. The first [read/right] *read/write* conductor 126 has a longitudinal axis 127 in the vicinity of the MRAM storage element 100. The first read conductor 128 also has a longitudinal axis 129. According to one embodiment of the invention, longitudinal axis 127 in the vicinity of MRAM storage element 100 is disposed substantially parallel to longitudinal axis 129. A first insulating layer 130 is disposed below the first read conductor 128 and electrically separates the read conductor 128 from a first write conductor 132. The second MRAM storage element 200 is coupled at an upper surface to a second read/write conductor 226 and at a lower surface to a second read conductor 228. The second [read/right] *read/write* conductor 226 has a longitudinal axis 227 in the vicinity of the MRAM storage element 100. The second read conductor 228 also has a longitudinal axis 229. Longitudinal axis 227 in the vicinity of MRAM storage element 200 is also disposed substantially parallel to longitudinal axis 229. A second insulating layer 230 is disposed below the speed read conductor 228 and separates it from a second write conductor 232.

Insulating material 154 is disposed around the upper portion 120 of the MRAM cell 10. Likewise, insulating material 254 is disposed around the lower portion 160 of the MRAM cell 10. The insulating materials 154, 254 may be a single material and may form a single body about both the upper 120 and lower 160 portions of the MRAM cell 10, or may be formed as a plurality of layers of insulating material.

A via 152 passes through the insulating materials 154, 254 between the first read controller 128 and second read conductor 228. An electrical conductor 150 within the via 152 electrically couples the first 128 and the second 228 read conductors.

Electric currents passed through the first read/write conductor 126 and first write conductor 132 can program the first MRAM storage element 100. Likewise, electric currents passed through the second read/write conductor 226 and second write conductor 232 can program the second MRAM storage element 200. The first and second MRAM storage elements 100, 200 can thus be independently programmed. The arrangement shown in FIG. 1A also allows the first and second MRAM storage elements 100, 200 to be independently read by the conductors 126, 128 for memory element 100 and conductors 226, 228 for memory element 200.

The cell 10 also includes an access transistor 240 that allows MRAM storage elements 100, 200 to be switchingly electrically connected to a ground. Transistor 240 includes a first drain region 252 disposed within the doped well 354. Also within the doped well 354 is a second source region 258 disposed in spaced relation to the first drain region 252. The source region 258 may be grounded through, for example, a metallic or polysilicon grounding conductor 259 to a remote source of ground potential 263. A channel region 264 is defined in the doped well 354 between the drain region 252 and source region 258. It should be understood that, transistor 240 may be an N-channel transistor or a P-channel transistor with corresponding source/drain conventions. Thus, the invention is not limited to a transistor 240 of a specific type.

The substrate 255 has an upper surface 266. A layer of gate insulating material 272 is formed over the upper surface 266 above the channel region 264. A gate conductor 276 is formed over insulating layer 272. In an exemplary embodiment, as shown in FIG. 1A, a landing pad 278 of conductive material, e.g., doped polysilicon, is formed in contact with the upper surface 266 of the substrate 255 above the drain region 252 to form an ohmic contact.

A via 353 passes through insulating material 254 between the landing pad 278 and the second read conductor 228. A conductor 350 within the via 352 electrically couples the second read conductor 228 to the landing pad 278, and thereby to the drain region 252. Accordingly, the first read conductor 128 is coupled to the drain region 252 by way of the first conductor 150, second read conductor 228, second conductor 350 and landing pad 278.

Figure 1B:
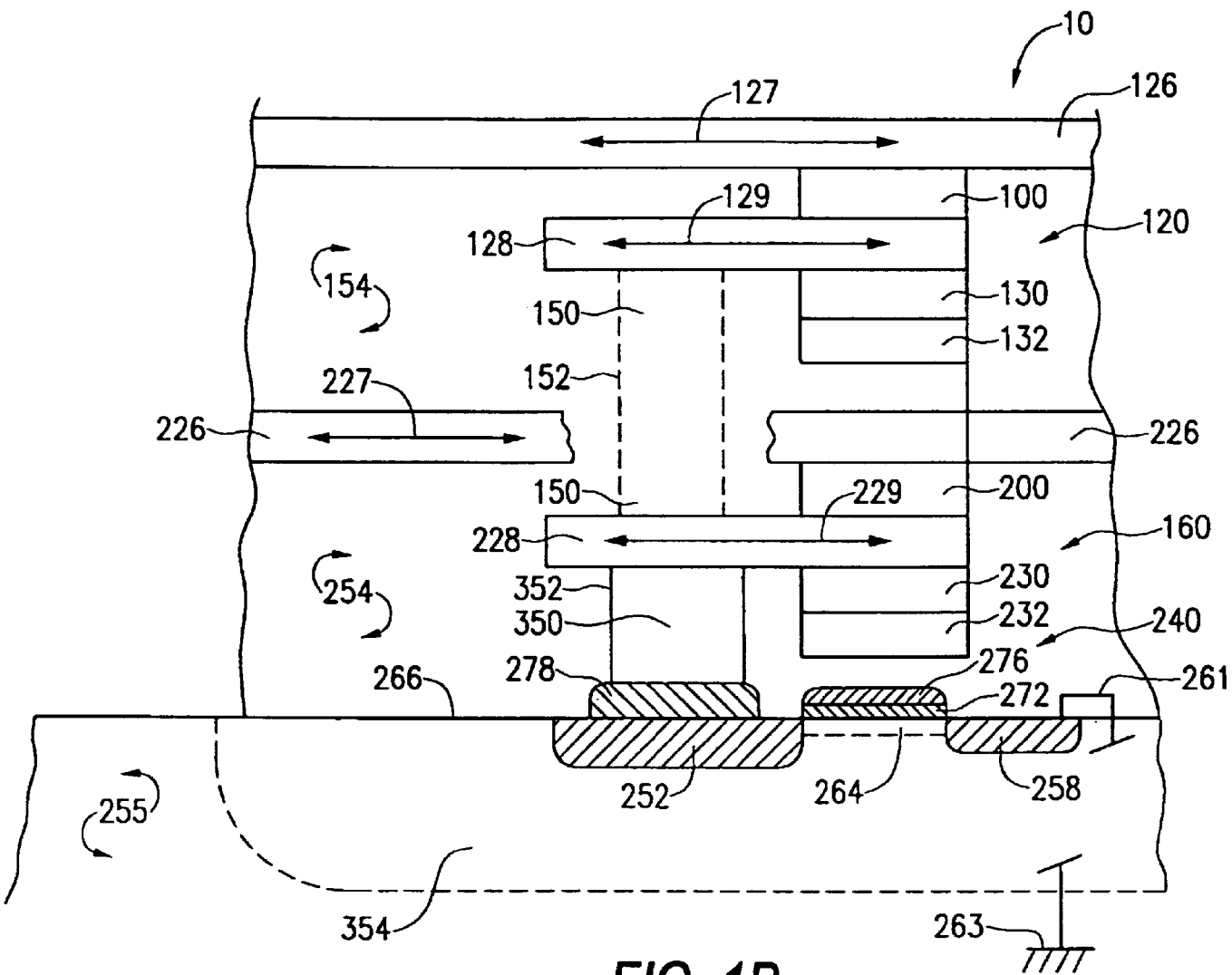
FIG. 1B shows a sectional side view of an MRAM cell according to one embodiment of the invention, including grounding through a grounded well.

FIG. 1B shows another embodiment of the invention. Like the embodiment of FIG. 1A access transistor 240 includes a grounded source region 258. Unlike the FIG. 1A embodiment, the FIG. 1B embodiment shows the source region 258 connected to the well 354 of doped semiconductor material. The doped well 354, in turn, is coupled to a source of ground potential 263 and serves as a ground for source region 258. The source region 258 may be coupled to the grounded well 354 by a conductor 261, such as a metallic or polysilicon conductor, and ohmic contacts.

Figure 3A:
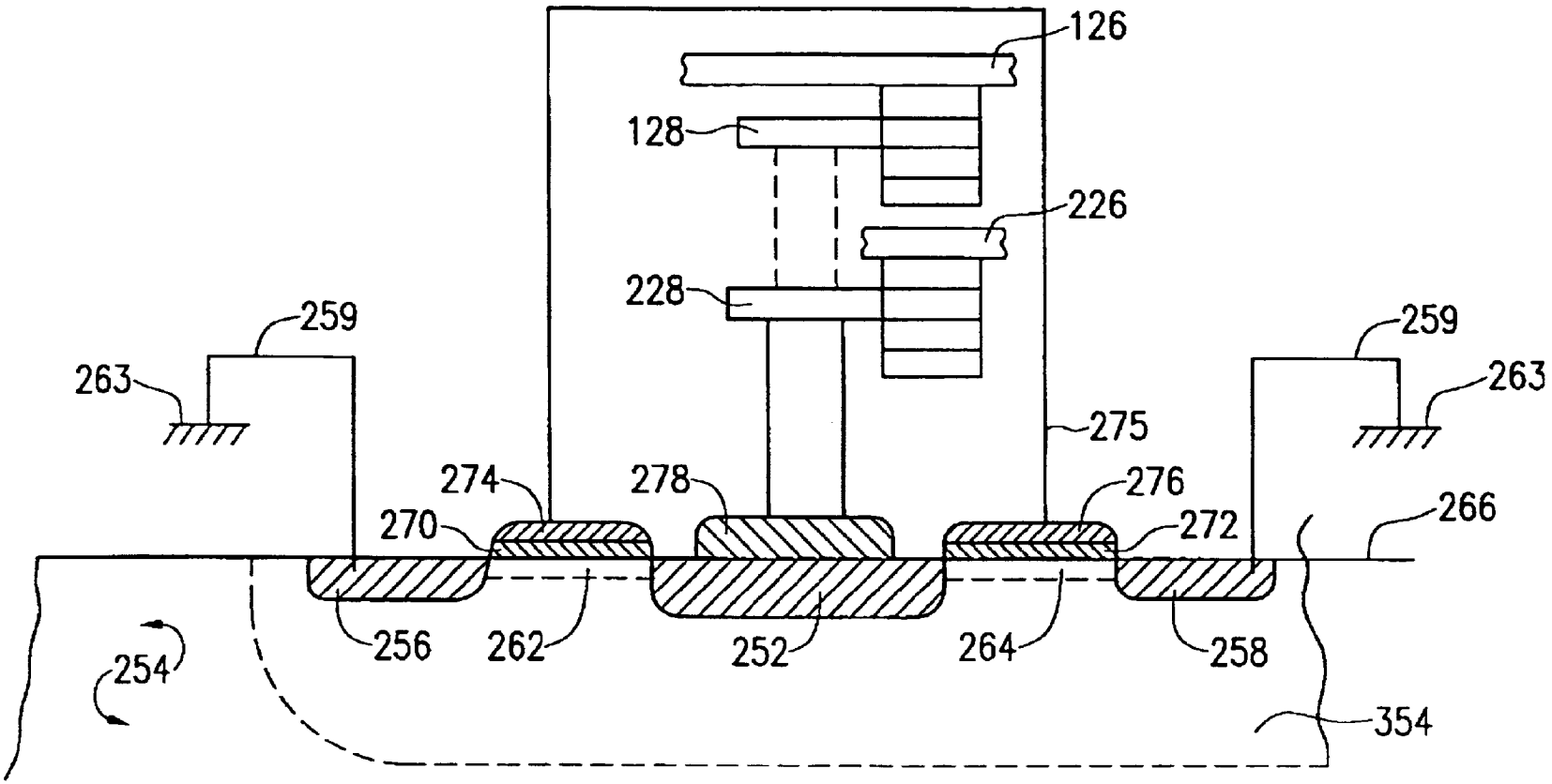
FIG. 3A shows a dual transistor structure.

Other access transistor structures may also be employed in place of transistor 240. In a further embodiment, for example, a dual transistor as shown in FIG. 3A is used. The advantage of this arrangement is that it is similar to a dual access transistor arrangement used in some FLASH memory devices. Therefore, the dual transistor arrangement of FIG. 3A may benefit from employing proven process technology. In addition, it may be possible to use existing production facilities, previously developed for manufacturing FLASH memory devices, to manufacture devices according to the present invention. The dual transistor has a second source region 256 disposed within the well 354 and coupled through a second channel region 262 to the drain region 252. A second gate 274 overlies the second channel above a second insulating layer 270. Gates 276 and 274 are mutually electrically coupled by a conductor 275 and operate together. Thus both transistors of the dual transistor structure are conductive simultaneously, and the two transistors of the dual transistor structure act in parallel to switchingly ground the read conductors 128, 228.

Figure 3B:
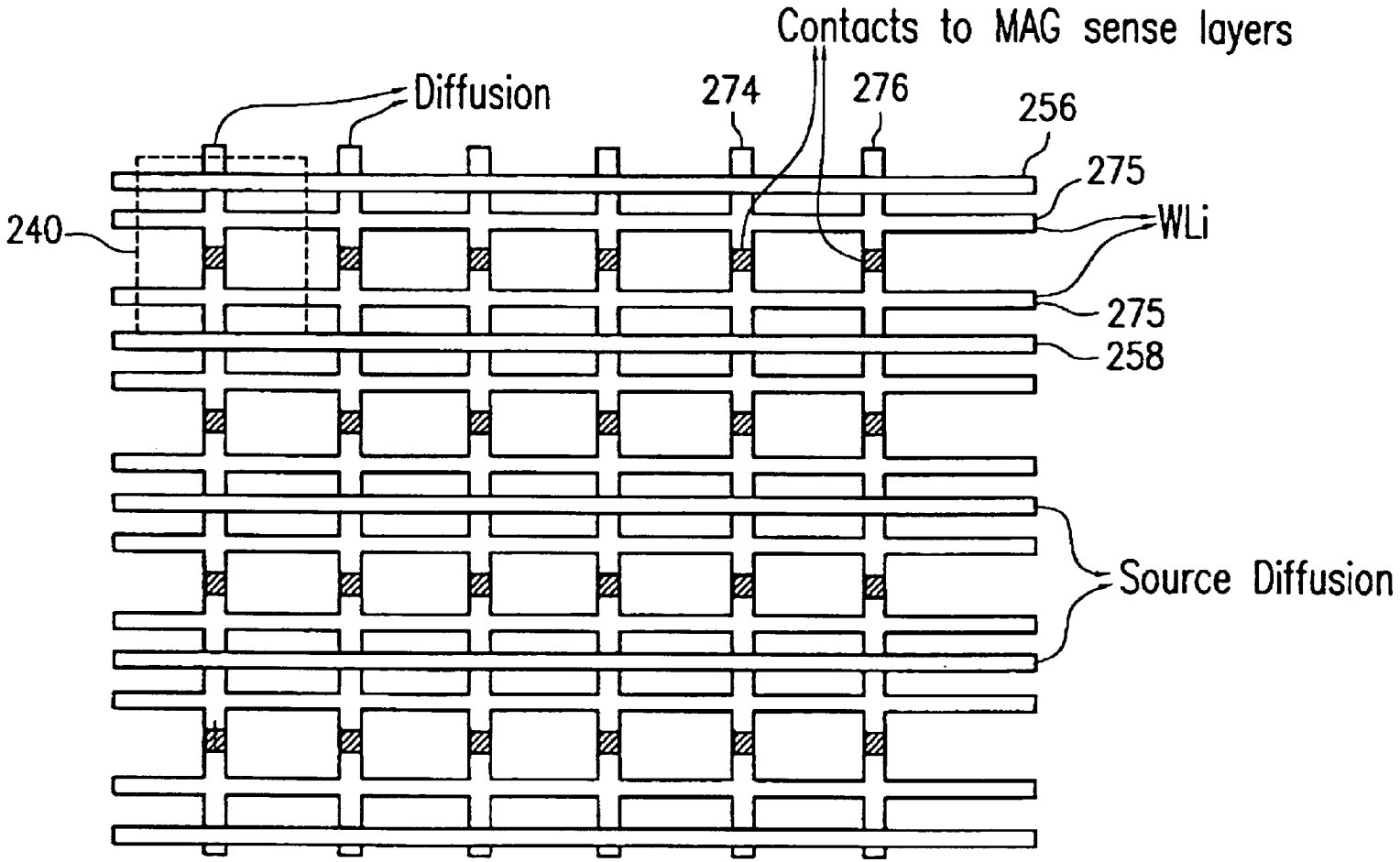
FIG. 3B shows a FLASH memory architecture.

FIG. 3B shows an arrangement of transistors such as might be used in a FLASH memory device. The array includes a plurality of conductors 275, transistor gates 274, 276, and regions 256, 258.

Figure 4A:
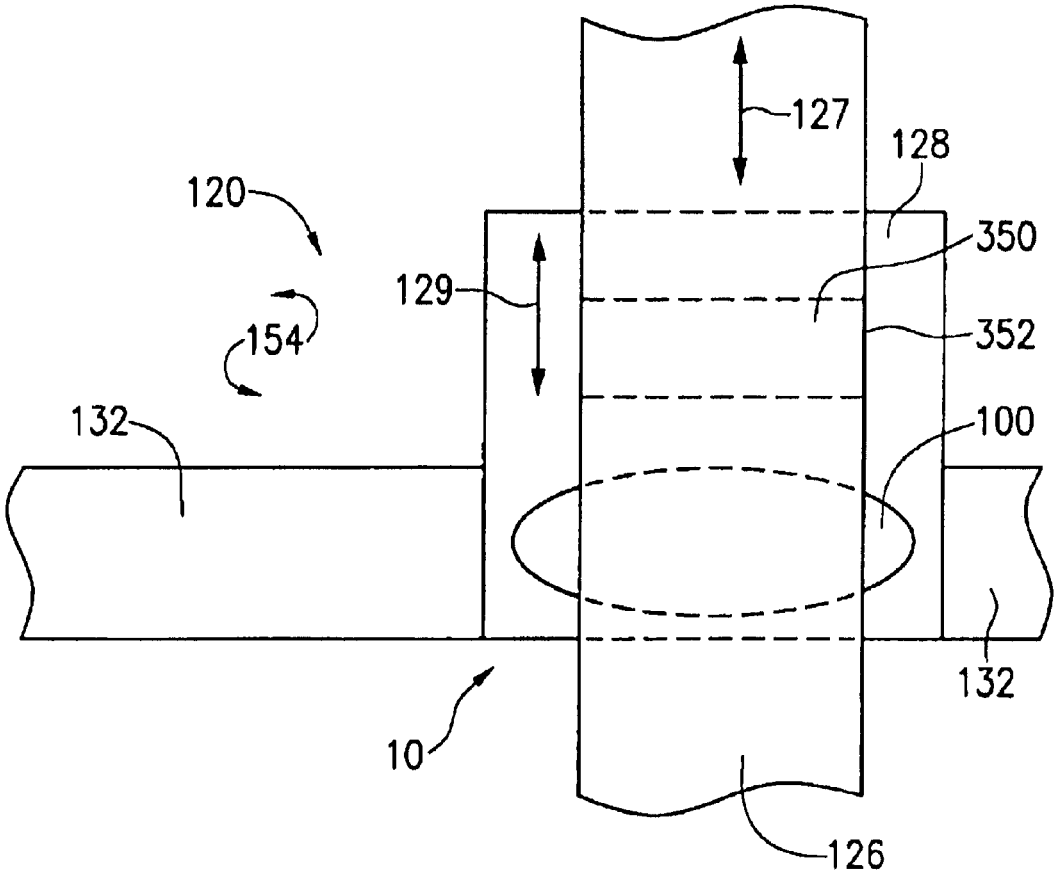
FIGS. 4A and 4B are illustrations showing top views of a portion of an MRAM cell according to different embodiments of the invention.

FIG. 4A shows a top view of a portion 120 of an MRAM cell 10 employed in the previously described embodiments of the invention. As seen in FIG. 4A the MRAM cell 10 includes portions of the conductors 126, 128, 132 that couple the MRAM storage element 100 to the control and sensing circuitry of the MRAM device. In the illustrated embodiment, the MRAM storage element 100 has a substantially elliptical configuration, as viewed from above. Read/write conductor 126 is disposed above the memory element 100 in contact with the sense layer 110 (as detailed in FIGS. 1 and 2). In like fashion, read conductor 128 is disposed below the storage element 100 in contact with the seed layer 102 (as shown in FIGS. 1 and 2). Below the read conductor 128 is a layer of insulating material 130 (as shown in FIG. 1A) that separates the read conductor 128 from a write conductor 132 that is disposed below the layer of insulating material 130. Also shown is the longitudinal axis 127 of the first [read/right] *read/write* conductor 126 substantially parallel to the longitudinal axis 129 of the first read conductor 128.

The read/write conductor 126 and the write conductor 132 are illustrated as being disposed in substantially perpendicular spaced relation to one another. In practice, the read/write conductor 126 and the write conductor 132 may be disposed in oblique spaced relation to one another, so as to allow a vector sum of magnetic fields produced about the read/write and write conductors to locally exceed a magnetization coercivity threshold of the sense layer, whereby the sense layer is re-magnetized and programmed.

Figure 4B:
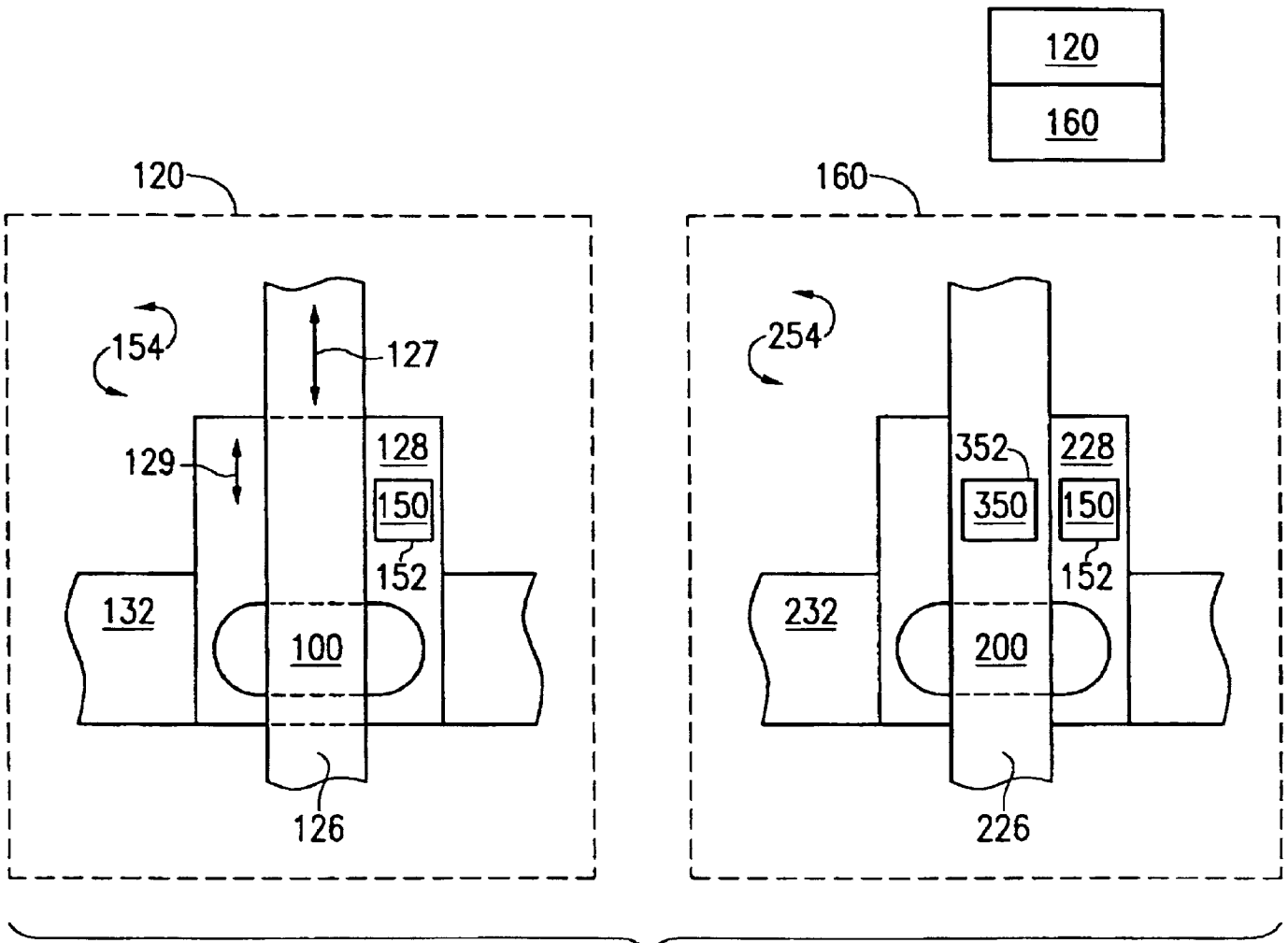

FIG. 4A also illustrates a conductor 350 passing through a via 352. The conductor 350 is coupled at a first end to the sense layer of the MRAM storage element 100 through the read conductor 128. The conductor 350 is coupled at a second end to an access transistor 240. In the illustrated embodiment of FIG. 4A, the read conductor 128, magnetic memory element 100 and read/write conductor 126 are surrounded by insulating material 154. FIG. 4B illustrates an embodiment having stacked [regions] *portions* 120, 160 of *for* memory cells. As illustrated *in FIG. 4B*, [region] *portion* 120 is stacked above [region] *portion* 160. [Region] *Portion* 120 includes a single MRAM storage element 100 and is substantially similar to FIG. 4A. However, [region] *portion* 120 also includes a via 152 filled with a conductor 150. The via 152 and conductor 150 couple the memory [cells 120, 160] *elements 100, 200* of the upper 120 and lower 160 [regions] *portions*. As shown in FIG. 4B, the lower [region] *portion* 160 is substantially similar to the upper [region] *portion 120*, but includes its own read/write conductor 226 and write conductor 232. It should be noted that only one of the [cells] *cell portions* 120, 160 includes the via 352 and conductor 350 which couples to the access transistor 240. In the exemplary embodiment illustrated in FIG. 4B, only the bottom cell 160 includes via 352 and conductor 350. Although FIG. 4B illustrates only two [regions] *portions* 120, 160, the principles of the present invention are also applicable embodiments employing more than two vertical [regions] *portions*. Further, while only one memory cell (e.g., cell *with element* 100) in shown in each [region] *portion*, in an actual memory device each [region] *portion* would include a large plurality of memory cells.

Figure 5:
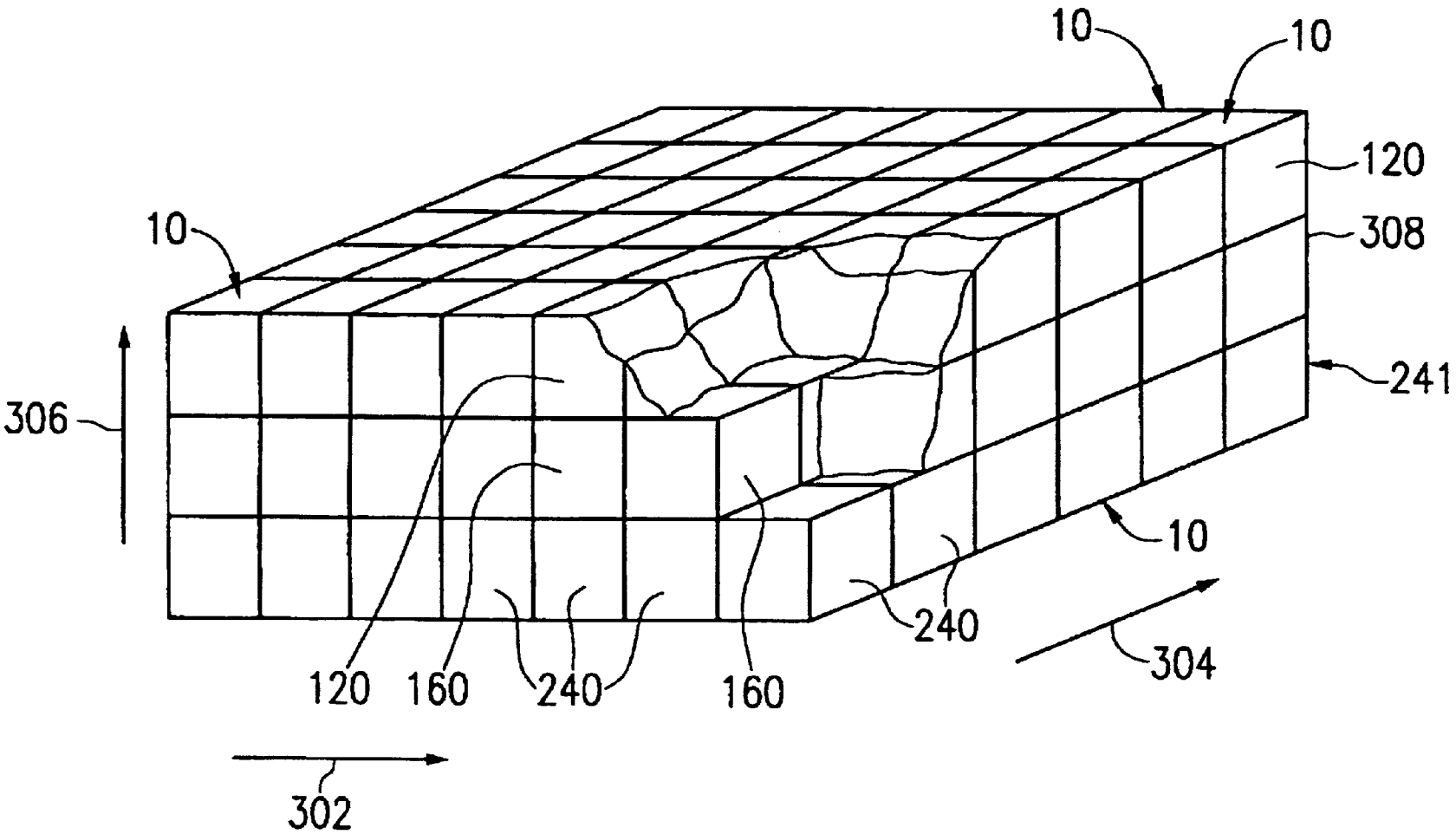
FIG. 5 shows a spatial relationship between memory cells according to one embodiment of the invention.

FIG. 5 shows a spatial relationship of memory cells 10 according to the various embodiments described above. Control transistors of a plurality of memory cells 10 are disposed in a first two-dimensional layer 241 which extends in a first direction 302 and a second direction 304. This layer includes the access transistors shown, for example, in FIGS. 1 and 3A. Also shown are a first layer of memory cell upper portions 120 and a second layer of memory cell lower portions 160. As shown, the layers of the upper and lower portions 120, 160 are stacked in a third direction 306 while each of the first and second memory portion layers extends two-dimensionally in the first and second directions 302, 304. Together, the layers of upper and lower memory cell portions 120, 160 form a three-dimensional array of memory cell portions 308. As discussed above, the control transistors 240 may each include a single transistor, a dual transistor, or another switching device. While FIG. 5 shows two layers of memory elements, additional memory element layers may also be provided, with stacked memory elements being connected with the access transistors in the manner illustrated in FIGS. 1 and 3.

Figure 6:
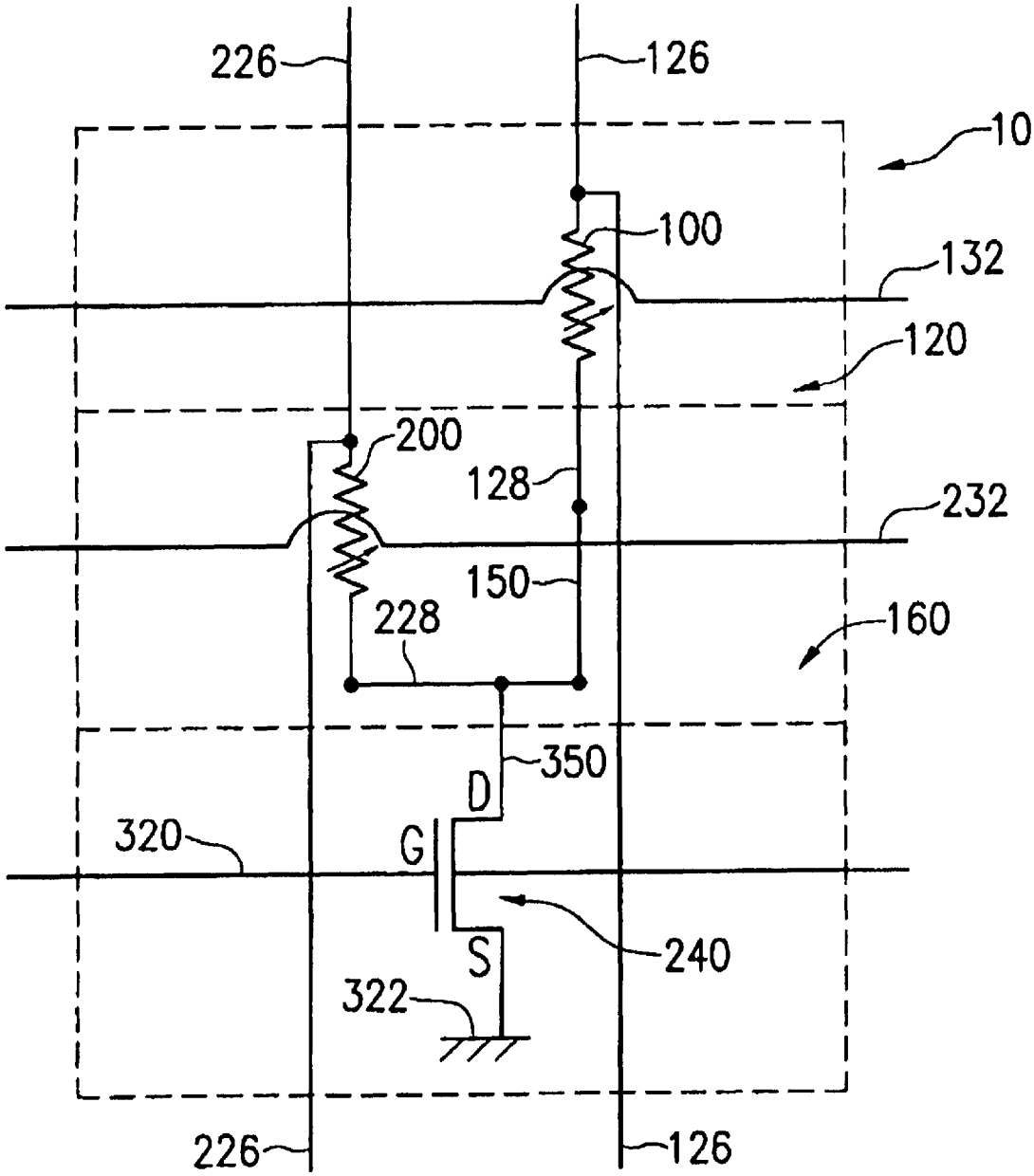
FIG. 6 shows, in electrical schematic form, an MRAM cell according to one aspect of the invention.

FIG. 6 shows the MRAM cell 10 described above with respect to FIG. 1A in electrical schematic form. The cell 10 includes upper portion 120, lower portion 160 and access transistor 240. The upper portion 120 includes the first MRAM storage element 100 and first write conductor 132. The lower portion 160 includes the second MRAM storage element 200 and second write conductor 232. The first read/write conductor 126 is coupled to one end of the first MRAM storage element 100, and the second read/write conductor 226 is coupled to a corresponding end of the second MRAM storage element 200. The respective other ends of the MRAM storage elements 100, 200 are coupled to the drain D of the access transistor 240. A word line conductor 320 is coupled to a gate G of the access transistor 240. The source S of the access transistor 240 is coupled to a source of constant potential such as ground 322.

Figure 7:
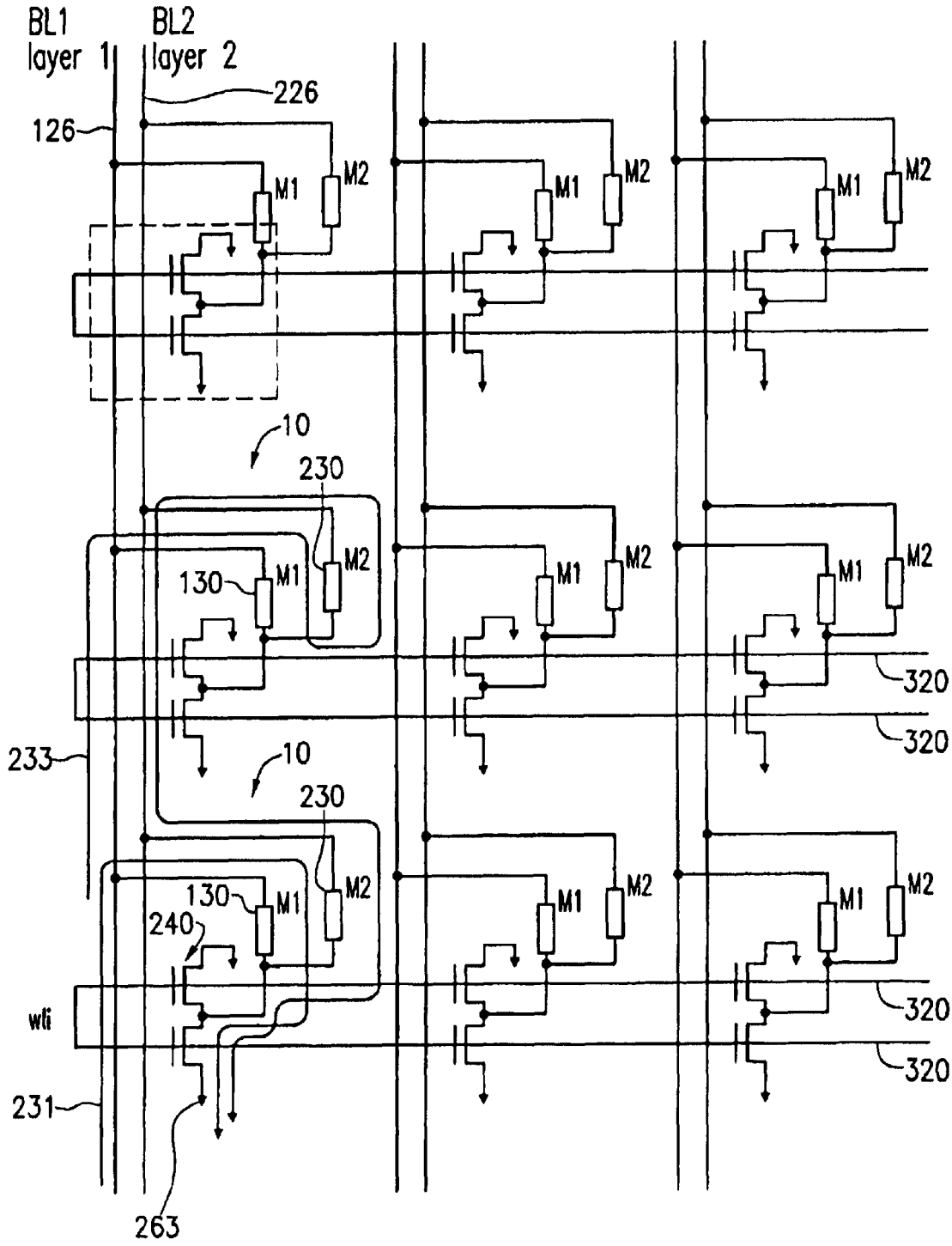
FIG. 7 shows a portion of an MRAM device illustrating electrical currents according to one aspect of the invention.

FIG. 7 shows a portion of the MRAM memory device according to one aspect of the invention. The MRAM device includes a plurality of memory cells 10, each having, for example, two resistive memory elements 130, 230. The resistive memory cells are each coupled to a respective read/write conductor 126, 226. Each memory cell also includes an access transistor 240. The access transistors are coupled at their gates to respective word line conductors 320 in a nor-structured architecture. Also illustrated is a path for a sense current 231 through a selected resistive memory element. The sense current 231 flows from the read/write conductor 126, through the selected memory element and the access transistor 240 to ground 263. One leakage current path 233 is also shown. The leakage current path shown 233 traverses a first read/write line 126, a first resistive memory element 130, a second resistive memory element 230, a second read/write line 226, and a third resistive memory element 230. The resulting sneak path resistance is significantly larger in comparison to the sneak path resistance present in a crosspoint architecture array. If R is the resistance value for a resistive memory element, the sneak path resistance according to one embodiment of the invention is equal to $((n+1)/(n-1))$. R/M, where n is the number of word lines and M is the number of resistive memory element in a typical cell 10. This contrasts with the sneak peak resistance which is $R/(n-1)$ where n is the number of rows or columns. The higher sneak path resistance, according to present invention, significantly reduces the difficulty of sensing the resistance state of a sensed memory element.

Figure 8:
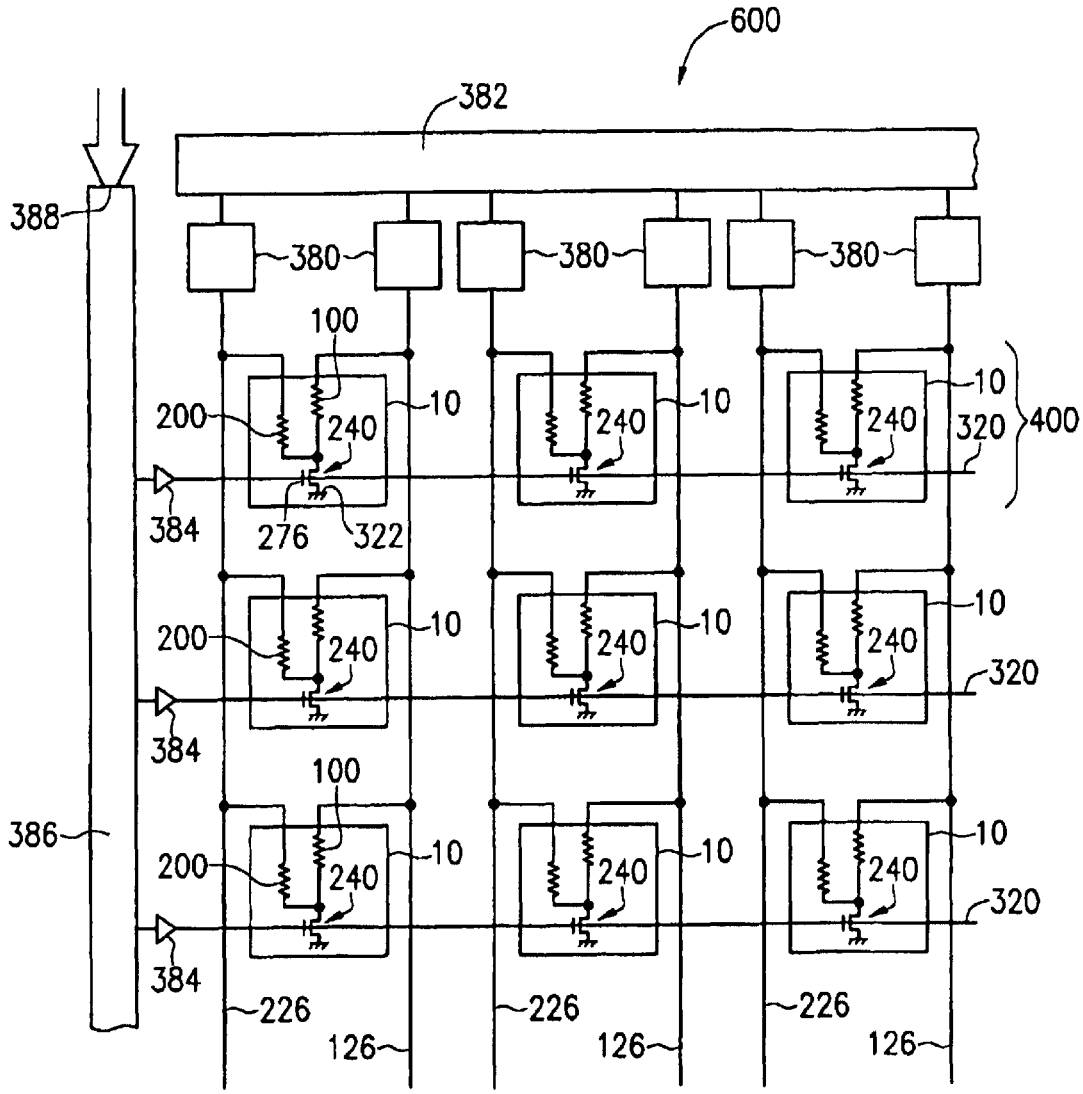
FIG. 8 shows a portion of an MRAM device according to one aspect of the invention.

FIG. 8 shows a portion of an MRAM memory device 600 with a memory array including a plurality of MRAM cells 10 in accordance with the FIG. 1A embodiment of the invention. A plurality of word lines 320 are shown coupled to respective gates 276 of the access transistors 240 of the MRAM cells 10. Read/write conductors 126, 226 are coupled to the magnetic storage elements 100, 200 of respective MRAM cells 10. The magnetic storage elements 100, 200 are switchingly coupled to ground 322 by their respective access transistors 240. Each read/write conductor 126, 226 is coupled to a respective selection and sensing circuit 380.

The selection and sensing circuits 380 switchingly couple the read/write conductors 126, 226 to sensing circuits that detect a resistive state of the storage elements 100, 200 and convey the sensed state to an output port or pipeline circuit 382 of the MRAM device 600. Read/write conductors 126, 226 that are not in use for sensing of a memory element 100, 200 are switchingly decoupled by the selection and sensing circuits 380 and allowed to float. The word lines 320 are coupled to respective outputs of respective line driver circuits 384. The line driver circuits 384 drive the respective gates 276 of access transistors 240 to a voltage that is alternately above or below a threshold voltage. Respective inputs of the line driver circuits 384 are electrically coupled to respective outputs of an address decoder circuit 386.

The address decoder circuit 386 receives a word selection address at an input 388 and responsively activates the appropriate line driver circuit 384. Operation of the access transistors 240 is thus controlled according to a word selection address received at the input 388 of the address decoder 386. Each access transistor 240 having a gate coupled to the active word line becomes conductive and electrically connects a respective a pair of MRAM storage elements 100, 200 to ground. Each MRAM storage element 100, 200 in a selected row 400 of MRAM cells 10 that is associated with the active word line 320 is available to be sensed. The selection and sensing circuits 380 are controlled such that a voltage of (or current into) a first read/write conductor (e.g., 226) is sensed while a second read/write conductor (e.g., 126) is allowed to float. This condition exists for each MRAM cell 10 of the selected row 400. Each sensed voltage (or current) is reflected by the respective sensing circuit 380 as a logical state and output to the pipeline circuit or output port 382. During a further read cycle, or portion of a read cycle, the selection and sensing circuits 380 are controlled to sense the second read/write conductor, i.e., 126, is sensed while 226 is allowed to float.

Figure 9:
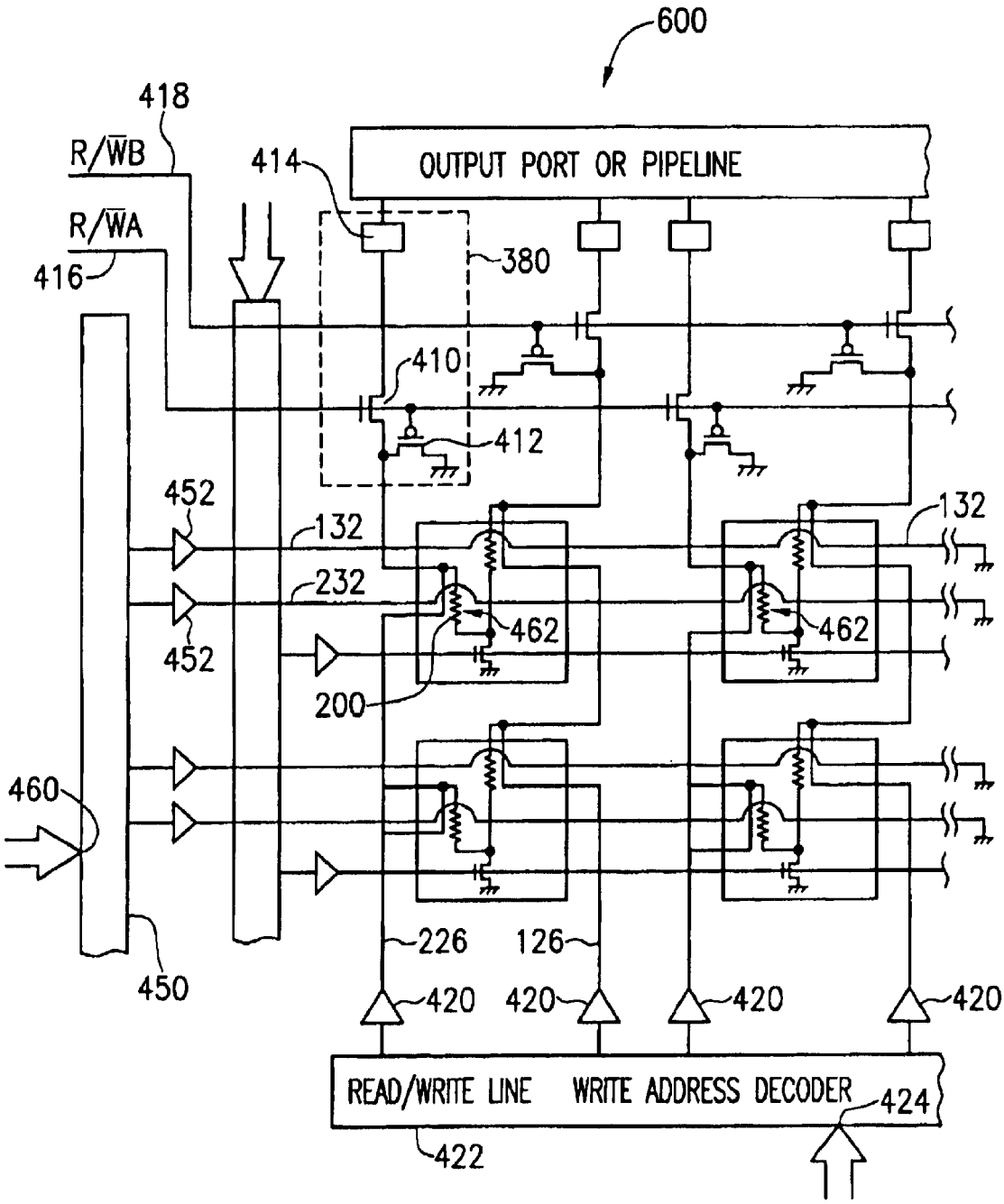
FIG. 9 shows a portion of an MRAM device according to one aspect of the invention.

FIG. 9 shows the MRAM 600 memory device of FIG. 8 with the addition of write circuitry. The selection and sensing circuits 380 are illustrated by column selection transistors 410, 412 and sensing circuits 414. The gates of the column selection transistors 410, 412 are controlled by respective enabling lines 418, 416. Accordingly, when a respective enabling line 416 is logic low, a plurality of corresponding column selection transistors 412 are conductive, whereby respective read/write conductors 226 are effectively grounded.

The read/write conductors 126, 226 are each coupled to an output of a respective write driver circuit 420. Each write driver circuit 420 is, in turn, coupled at a respective input to a read/write (conductor) write address decoder circuit 422. In response to a particular address received at an address input 424 of the read/write conductor write address decoder 422, a respective write driver circuit 420 sources a first write current onto the respective read/write conductor (e.g., 226). During an overlapping time interval, a write line write address decoder 450 outputs a signal to one of a plurality of write line drivers 452. The write line write address decoder 450 selects the particular write line driver 452 based on an input received at an address input 460 of the decoder 450. The selected write line driver 452 sources a second write current onto the respective write line (e.g., 232). The combined effect of the first and second write currents is to generate a localized magnetic field in the vicinity of a particular MRAM storage element 100 and 200, (e.g., identified as 462 in FIG. 9 for one memory element 200). The localized magnetic field is sufficient to rotate the respective magnetic domains and consequently reverse the magnetic field of the respective sense layer 110 (as seen in FIG. 2) of the MRAM storage element 200. Accordingly, the logical data state represented by the MRAM storage element 200 is changed.

The various write drivers 420, 452 are each adapted to receive a signal controlling the direction of the current output by the respective driver so that either a "1" or a "0" may be written to a particular MRAM storage element 100, 200 (i.e., the storage element 100, 200 may be written or erased). After writing is complete, the respective states of the enabling lines 416, 418 are restored to a "read mode" state such that transistors 412 become non-conductive and transistors 410 becomes conductive.

Figure 10:
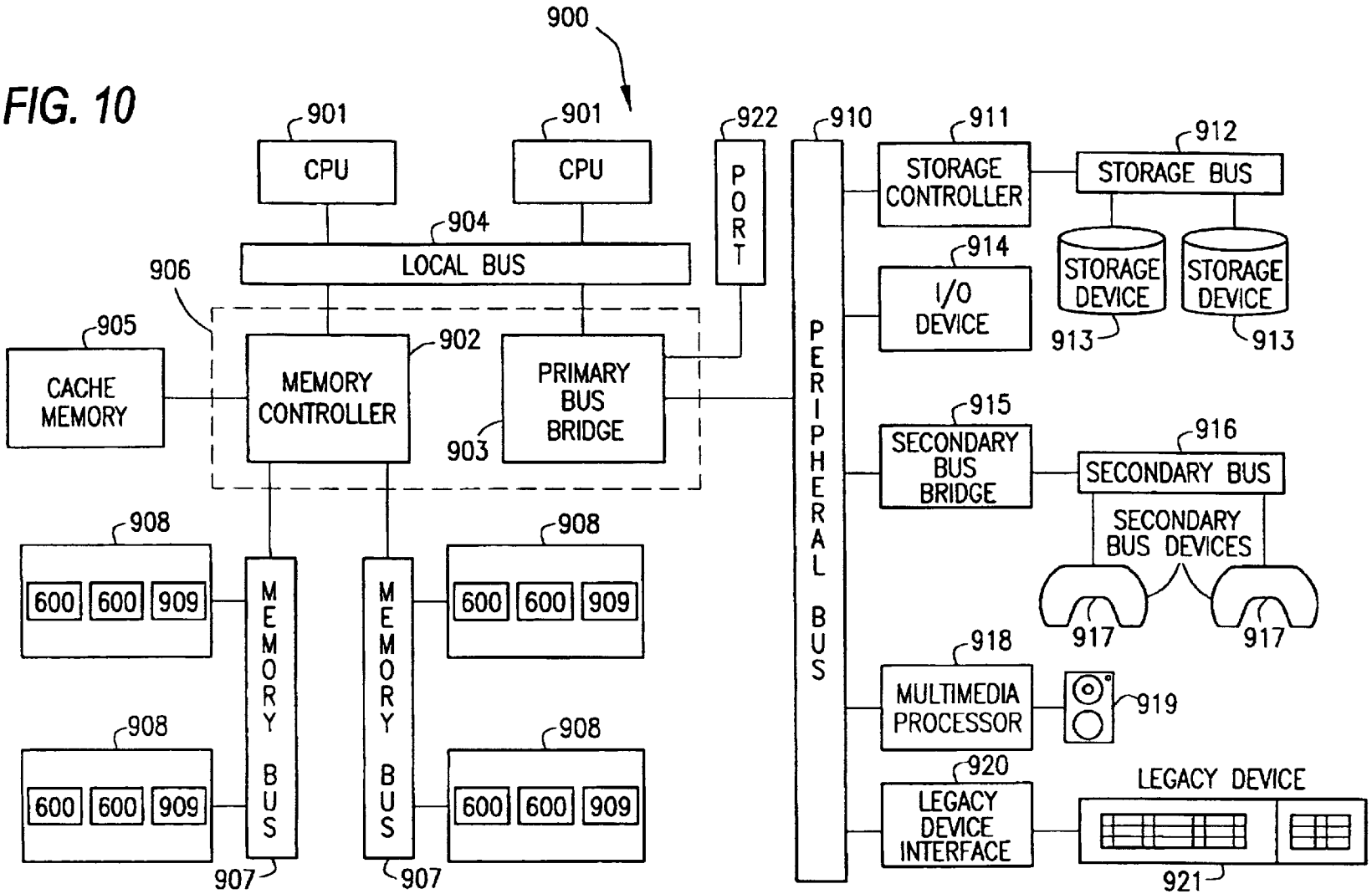
FIG. 10 shows a block diagram of a digital system incorporating an MRAM memory device according to one aspect of the invention.

FIG. 10 illustrates an exemplary processing system 900 which may utilize the memory device 600 of the present invention. The processing system 900 includes one or more processors 901 coupled to a local bus 904. A memory controller 902 and a primary bus bridge 903 are also coupled the local bus 904. The processing system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus accepts memory components 908 which include at least one resistive memory device, e.g., MRAM memory device, 600 of the present invention. The memory components 908 may be a memory card or a memory module. Examples of memory modules include single inline memory modules (SIMMs) and dual inline memory modules (DIMMs). The memory components 908 may include one or more additional devices 909. For example, in a SIMM or DIMM, the additional device 909 might be a configuration memory, such as a serial presence detect (SPD) memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 include peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 is coupled to at least one peripheral bus 910. Various devices, such as peripherals or additional bus bridges may be coupled to the peripheral bus 910. These devices may include a storage controller 911, a miscellaneous I/O device 914, a secondary bus bridge 915 communicating with a secondary bus 916, a multimedia processor 918, and a legacy device interface 920. The primary bus bridge 903 may also coupled to one or more special purpose high speed ports 922. In a personal computer, for example, the special purpose port might be the Accelerated Graphics Port (AGP), used to couple a high performance video card to the processing system 900.

The storage controller 911 couples one or more storage device 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be a local area network interface, such as an Ethernet card. The secondary bus bridge 915 may be used to interface additional devices via another bus to the processing system. For example, the secondary bus bridge may be a universal serial port (USB) controller used to couple USB devices 917 to the processing system 900. The multimedia processor 918 may be a sound card, a video capture card, or any other type of media interface, which may also be coupled to one or more additional devices such as speakers 919. The legacy device interface 920 is used to couple at least one legacy device 921, for example, older style keyboards and mice, to the processing system 900.

The processing system 900 illustrated in FIG. 10 is only an exemplary processing system with which the invention may be used. While FIG. 9 illustrates a processing architecture especially suitable for a general purpose computer, such as a personal computer or a workstation, it should be recognized that well known modifications can be made to conFig. the processing system 900 to become more suitable for use in a variety of applications. For example, many electronic devices which require processing may be implemented using a simpler architecture which relies on a CPU 901 coupled to memory components 908 and/or memory devices. The modifications may include, for example, elimination of unnecessary components, addition of specialized devices or circuits, and/or integration of a plurality of devices.

Although the invention has been illustrated as a memory cell 10 having two independently controlled memory elements 100, 200 sharing a common access transistor, the principles of the invention may be extended to three or more independently controlled memory elements stacked in the manner of memory elements 100, 200. In any case, the result is a three-dimensional array of memory elements formed of layers of memory elements stacked in first direction. Each transistor of a two-dimensional array of transistors controls the memory elements stacked above it in the three-dimensional array.

While exemplary embodiments of the invention have been described in the illustrations above, it should be understood that these are not to be considered as limiting. Although, for exemplary purposes, the discussion above primarily covers devices with MRAM memory elements, devices with other memory elements, such as PCRAM memory elements, also fall within the invention. Addition, deletions, substitutions, and other modifications can be made without departing from the spirit or scope of the present invention. Accordingly, the invention is not to be considered as limited by the foregoing description but is only limited by the scope of the appended claims.

What is claimed as new and desired to be protected by Letters Patent of the United States is:

1. A magnetic random access memory cell comprising:

a first magnetic storage element having a first sense layer and a first pinned layer;

a second magnetic storage element having a second sense layer and a second pinned layer, said first and second sense layers being mutually electrically coupled through first and second read conductors, said first and second read conductors having respective longitudinal axes, said first and second pinned layers being electrically coupled to respective first and second read/write conductors, said first and second read/write conductors having at least localized longitudinal axes in respective vicinities of said first and second magnetic storage elements, said at least localized longitudinal axes of said first read/write conductor being oriented substantially parallel to said longitudinal axis of said first read conductor;

a switching device coupled to said mutually coupled pinned layers through said first and second read conductors and configured to couple said mutually coupled pinned layers to a conductor for receiving a substantially constant potential.

2. A magnetic random access memory cell as defined in claim 1 wherein said substantially constant potential comprises a ground potential.

3. A magnetic random access memory cell as defined in claim 1 wherein said first magnetic storage element and said second magnetic storage element are disposed above said switching device in a first direction, and wherein said switching device is disposed adjacent to a second switching device of a second magnetic random access memory cell.

4. A memory device comprising:

a plurality of read/write conductors respectively paired with a plurality of read conductors, said respectively paired read/write and read conductors having substantially parallel longitudinal axes; *and* at least one memory cell electrically coupled to each said respectively paired read/write conductor and read conductor, said at least one memory cell including a transistor and two resistive memory elements, said two resistive memory elements being electrically connected in series by respective said read conductors, said two resistive memory elements being mutually coupled to said transistor at a common node.

5. A memory device as defined in claim 4 wherein:

said two resistive memory elements each include a pinned layer and a sense layer; and wherein said sense layer of each said resistive memory element is electrically coupled through said transistor to a conductor for receiving a substantially constant electrical potential.

6. A memory device as in claim 5 wherein said substantially constant electrical potential is a ground potential.

7. A memory device as defined in claim 4 wherein said transistor comprises:

two transistors having a common drain connection and respective gate terminals, said gate terminals mutually coupled to one another.

8. A memory device as defined in claim 4 wherein:

said first and second resistive memory elements are disposed in layered spaced relation to one another above said transistor.

9. A memory device as defined in claim 4 further comprising:

a word line conductor electrically coupled to a gate of said transistor.

10. A memory integrated circuit comprising:

a first two-dimensional array of resistive memory elements disposed in substantially parallel spaced relation between a second two-dimensional array of resistive memory elements and a third two-dimensional array of isolation devices, each isolation device of said third two-dimensional array being coupled to at least one resistive memory element of said first two-dimensional array and at least another resistive memory element of said second two-dimensional array;

a first plurality of read/write conductors having respective longitudinal axes oriented in a first direction and coupled to said first two-dimensional array of resistive memory elements; and a second plurality of read conductors having respective longitudinal axes also oriented in said first direction and also coupled to said first two-dimensional array of resistive memory elements.

11. A memory integrated circuit as defined in claim 10 wherein said first array of resistive memory elements comprises an array of MRAM memory elements.

12. A memory integrated circuit as defined in claim 10 wherein said first array of resistive memory elements comprises an array of progrmamable conductive memory elements.

13. A memory integrated circuit as defined in claim 10 further comprising:

a sensing circuit, said sensing circuit adapted to sense a state of said resistive memory elements during a time interval when a respective isolation device is activated.

14. A memory integrated circuit comprising:

a plurality of memory cells, each cell including:

first and second resistive memory storage elements, said first and second resistive memory storage elements being electrically coupled to respective first and second memory sensing circuits, said first and second resistive memory storage elements being mutually coupled to a reference potential through a common dual transistor.

15. A memory integrated circuit as defined in claim 14 wherein said first and second resistive memory storage elements are disposed in spaced relation above said common dual transistor.

16. A memory integrated circuit as defined in claim 14 further comprising an address decoder electrically coupled to first and second gates of said dual transistor and adapted to activate said dual transistor in response to an address signal received at an address input of said address decoder.

17. A magnetic random access memory device comprising:

a semiconductor substrate having an upper surface;

a transistor having a drain region supported by said semiconductor substrate;

a first magnetic random access memory storage element over said upper surface and above said drain region and electrically coupled to said drain region through a first read conductor, said first read conductor having a first longitudinal axis;

a second magnetic random access memory storage element over said upper surface and above said first magnetic random access memory storage element and electrically coupled to said first magnetic random access memory storage element and said drain region through a second read conductor, said second read conductor having a second longitudinal axis; and first and second read/write conductors having respective third and fourth longitudinal axes, said first longitudinal axis being disposed substantially parallel to said third longitudinal axis, said second longitudinal axis being disposed substantially parallel to said fourth longitudinal axis.

18. A programmable conductive memory device comprising:

a semiconductor substrate having an upper surface;

a transistor having a drain region supported by said semiconductor substrate;

a first programmable conductive memory storage element disposed above said upper surface and electrically coupled to said drain region by a first read conductor, said first read conductor having a first longitudinal axis;

a second programmable conductive memory storage element disposed above said first programmable conductive memory storage element and electrically coupled to said first programmable conductive memory storage element and said drain region through a second read conductor, said second read conductor having a second longitudinal axis; and first and second read/write conductors having respective third and fourth longitudinal axes, said first longitudinal axis being disposed substantially parallel to said third longitudinal axis, said second longitudinal axis being disposed substantially parallel to said fourth longitudinal axis.

19. A method of [manufacturing] *forming* a [digital data storage] *memory* device, comprising:

forming a transistor layer[, including a plurality of transistors,] over a semiconductor substrate*, said transistor layer comprising an array of transistors*;

forming a first [resistive] memory [storage] layer over said transistor layer, said first [resistive] memory [storage] layer comprising a plurality of first resistive memory [storage structures] *elements*, [each of said plurality of first resistive memory storage structures including respectively paired] *and a plurality of first* read conductors and *first* read/write conductors, *said first read conductors and said first read/write conductors being respectively coupled with said plurality of first resistive memory elements,* wherein said *first* read conductors and said *first* read/write conductors each have [a] respective *first* longitudinal [axis and said longitudinal axes of said respectively paired read conductors and read/write conductors] *axes, which* are [disposed in a] substantially parallel [relationship];

forming a second [magnetic] memory [storage] layer over said first [magnetic] memory [storage] layer, said second [magnetic] memory [storage] layer comprising a plurality of second [magnetic] *resistive* memory [storage structures] *elements, and a plurality of second read conductors and second read/write conductors, said second read conductors and said second read/write conductors being respectively coupled with said plurality of first resistive memory elements, wherein said second read conductors and said second read/write conductors each have respective second longitudinal axes, which are substantially parallel to said first longitudinal axes*; and electrically coupling respective ones of [said plurality of] *said* transistors, said [plurality of] first [magnetic memory storage structures] *read conductors*, and said [plurality of] second [magnetic memory storage structures] *read conductors*.

20. [A] *The* method of [manufacturing a digital data storage device as defined in] claim 19, further comprising forming [a control circuit over said semiconductor substrate, said control circuit being configured for activating] said plurality of transistors, *said plurality of first resistive memory elements, and said plurality of second resistive memory elements in a three-dimensional memory array comprising said transistor layer, said first memory layer and said second memory layer*.

21. A processing system comprising:

a plurality of memory cells, each cell including:

first and second resistive memory storage elements, said first and second resistive memory storage elements being electrically coupled to respective first and second memory sensing circuits, said first and second resistive memory storage elements being mutually coupled to a reference potential through a wired-NOR FLASH memory transistor.

22. A method of forming a memory device comprising:

forming a plurality of NOR FLASH-memory transistors disposed in an array over a semiconductor substrate;

forming an array of first resistive memory elements over said transistors;

forming an array of second resistive memory elements over said first resistive memory elements; and electrically coupling at least one second resistive memory element to a respective first resistive memory element and to a respective transistor.

*23. A memory device comprising:*

*a first magnetic storage element and a second magnetic storage element, wherein said first and second magnetic storage elements are electrically coupled through associated respective first and second read conductors and said first and second read conductors have substantially parallel respective first longitudinal axes;*

*respective first and second read/write conductors electrically coupled to said first and second magnetic storage elements, said first and second read/write conductors having substantially parallel respective second longitudinal axes, said first longitudinal axes are substantially parallel to said second longitudinal axes;*

*respective first and second write conductors associated with said first and second magnetic storage elements, wherein said first and second write conductors have substantially parallel third longitudinal axes which are non-parallel relative to said first and second longitudinal axes; and*

*a switching device coupled to said first and second read conductors.*

*24. The memory device of claim 23, wherein said switching device is configured to couple said first and second read conductors to a constant potential conductor.*

*25. The memory device of claim 24, wherein said constant potential conductor is a ground potential conductor.*

*26. The memory device of claim 23, wherein said switching device comprises an access transistor.*

*27. The memory device of claim 23, wherein said first read/write conductor is over said first magnetic storage element, wherein said first magnetic storage element is over said first write conductor, and wherein said first write conductor is over said first write conductor.*

*28. The memory device of claim 23, wherein said first write conductor is over said second read/write conductor, wherein said second read/write conductor is over said second magnetic storage element, wherein said second magnetic storage element is over said second read conductor, wherein said second read conductor is over said second write conductor, wherein said second write conductor is over said switching device, and wherein said switching device is over a substrate.*

*29. The memory device of claim 23, wherein said third longitudinal axes are at an oblique angle relative to said first and second longitudinal axes.*

*30. The memory device of claim 23, wherein said third longitudinal axes are substantially orthogonal to said first and second longitudinal axes.*

*31. A memory device, comprising:*

*an array of memory cells, each said memory cell comprising at least two memory elements electrically coupled to a common read circuit and therethrough to an access transistor, said access transistor being connected to one of a plurality of wordlines, wherein each of said two memory elements is also electrically coupled to a respective read/write line; and*

*wherein a sneak path resistance for reading one of said memory cells is determined by the formula* $((n+1)/(n-1))\cdot R/M$, *where R is the resistance value for one of said memory elements, n is the number of wordlines of said array and M is the number of memory elements in each of said memory cells.*

*32. The memory device of claim 31, wherein said access transistor is paired with a second access transistor in a NOR architecture.*

*33. The memory device of claim 31, wherein each of said memory cells has exactly two memory elements.*

*34. The memory device of claim 31, wherein said memory elements are MRAM memory elements.*

*35. A method of reading a memory device comprising a memory cell comprising at least two memory elements electrically coupled to one another by respective read lines and each said memory element being connected to a respective read/write line, wherein said read lines of said memory cells are electrically coupled to a respective access transistor and a wordline respectively coupled to a gate of said access transistor, said method comprising:*

*electrically connecting said at least two memory elements to ground by activating said wordline;*

*selecting a read/write line associated with one of said at least two memory elements; and*

*sensing the resistivity state of the memory element associated with the selected read/write line as a logic state while allowing the other of said at least two memory elements to float.*

*36. The method of claim 35, wherein said sensing the resistivity detects a voltage of the read/write line.*

*37. The method of claim 35, wherein said sensing the resistivity detects a current into the read/write line.*

*38. A method of writing a memory device comprising a plurality of memory cells, each comprising at least first and second memory elements electrically coupled to one another by respective read lines and each said memory element being connected to a respective read/write line and associated with a respective write line, wherein respective said read lines of each said memory cell are electrically coupled to a respective access transistor, said method comprising:*

*addressing said first memory element by selecting a respective read/write line and write line;*

*supplying a first write current to the respective read/write line; and*

*supplying a second write current to the respective write line.*

*39. The method of claim 38, wherein said addressing a memory element comprises activating a read/write line write address decoder and a write line write address decoder.*

*40. The method of claim 38, wherein said supplying of first and second write currents forms a localized magnetic field at said first memory element.*

*41. The method of claim 38, further comprising restoring said first memory element to a read mode.*

* * * * *

UNITED STATES PATENT AND TRADEMARK OFFICE

CERTIFICATE OF CORRECTION

PATENT NO. : RE 40,995 E
APPLICATION NO. : 11/905752
DATED : November 24, 2009
INVENTOR(S) : Ramin Ghodsi It is certified that error appears in the above-identified patent and that said Letters Patent is hereby corrected as shown below:

In column 11, line 48, in Claim 12, delete "progrmamable" and insert -- programmable --, therefor.

In column 12, line 50, in Claim 18, before "said" insert -- and --.

In column 13, line 64, in Claim 23, before "*said*" insert -- *wherein* --.

Signed and Sealed this

Sixteenth Day of February, 2010

David J. Kappos

David J. Kappos
*Director of the United States Patent and Trademark Office*